United States Patent
Olson et al.

(10) Patent No.: US 12,261,140 B2
(45) Date of Patent: Mar. 25, 2025

(54) STACKABLE FULLY MOLDED SEMICONDUCTOR STRUCTURE WITH VERTICAL INTERCONNECTS

(71) Applicant: Deca Technologies USA, Inc., Tempe, AZ (US)

(72) Inventors: Timothy L. Olson, Phoenix, AZ (US); Edward Hudson, San Tan Valley, AZ (US); Craig Bishop, Scottsdale, AZ (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 17/368,743

(22) Filed: Jul. 6, 2021

(65) Prior Publication Data

US 2021/0335744 A1    Oct. 28, 2021

Related U.S. Application Data

(63) Continuation of application No. 16/904,404, filed on Jun. 17, 2020, now Pat. No. 11,056,453.
(Continued)

(51) Int. Cl.
*H01L 23/00* (2006.01)
*H01L 21/56* (2006.01)
*H01L 25/065* (2023.01)

(52) U.S. Cl.
CPC ............ *H01L 24/19* (2013.01); *H01L 21/561* (2013.01); *H01L 21/568* (2013.01); *H01L 24/11* (2013.01);
(Continued)

(58) Field of Classification Search
CPC ....... H01L 24/19; H01L 21/568; H01L 24/11; H01L 2224/11001
See application file for complete search history.

(56) References Cited

U.S. PATENT DOCUMENTS

| 4,740,414 A | 4/1988 | Shaheen |
| 5,548,091 A | 8/1996 | Distefano et al. |

(Continued)

FOREIGN PATENT DOCUMENTS

| CN | 101459152 A | * | 6/2009 | ............ H01L 24/97 |
| CN | 104602459 A | * | 5/2015 | ........... H05K 3/3452 |

(Continued)

OTHER PUBLICATIONS

Kwak, Hocheol and Hubing. Todd, an Overview of Advanced Electronic Packaging Technology, May 1, 2007.
(Continued)

*Primary Examiner* — Mohammad M Choudhry
(74) *Attorney, Agent, or Firm* — Booth Udall Fuller, PLC; Bryce W. Burnham

(57) ABSTRACT

A method of making a semiconductor device may include providing a carrier and forming a first photoresist over the carrier with first openings through the first photoresist. A non-planar conductive seed layer may be formed over the first photoresist and conformally extend into the first openings through the first photoresist. A second photoresist may be formed over the first photoresist and over the non-planar conductive seed layer. The second photoresist layer may be patterned to form second openings through the second photoresist that extend to the non-planar conductive seed layer. Conductive posts may be plated over the non-planar conductive seed layer and within the second openings. The second photoresist may be removed while leaving in place the first photoresist. A semiconductor die may be coupled to the carrier. The semiconductor die, the conductive posts, and the first photoresist may be encapsulated with mold compound.

19 Claims, 10 Drawing Sheets

Related U.S. Application Data

(60) Provisional application No. 62/863,179, filed on Jun. 18, 2019.

(52) U.S. Cl.
CPC .......... *H01L 24/96* (2013.01); *H01L 25/0652* (2013.01); *H01L 2224/11001* (2013.01)

(56) References Cited

U.S. PATENT DOCUMENTS

| | | |
|---|---|---|
| 7,456,496 B2 | 11/2008 | Hwee et al. |
| 7,476,980 B2 | 1/2009 | Rebibis et al. |
| 7,482,203 B2 | 1/2009 | Song et al. |
| 7,550,857 B1 | 6/2009 | Longo et al. |
| 7,777,351 B1 | 8/2010 | Berry et al. |
| 7,829,380 B2 | 11/2010 | Irsigler et al. |
| 7,843,052 B1 | 11/2010 | Yoo et al. |
| 7,888,184 B2 | 2/2011 | Shim et al. |
| 8,030,770 B1 | 10/2011 | Juskey et al. |
| 8,237,259 B2 | 8/2012 | Pressel et al. |
| 8,288,209 B1 | 10/2012 | Chi et al. |
| 8,354,304 B2 | 1/2013 | Chow et al. |
| 8,436,255 B2 | 5/2013 | Goh |
| 8,487,435 B2 | 7/2013 | Juskey et al. |
| 8,653,674 B1 | 2/2014 | Darveaux et al. |
| 8,669,655 B2 | 3/2014 | Geitner et al. |
| 10,720,417 B2 | 7/2020 | Scanlan |
| 10,833,052 B2 | 11/2020 | Shih |
| 2002/0092676 A1 | 7/2002 | Jimarez |
| 2003/0027373 A1 | 2/2003 | Distefano et al. |
| 2003/0092217 A1 | 5/2003 | Coyle |
| 2003/0164554 A1 | 9/2003 | Fee et al. |
| 2005/0051877 A1 | 3/2005 | Hsu |
| 2005/0208700 A1 | 9/2005 | Kwon et al. |
| 2006/0275949 A1 | 12/2006 | Farnworth et al. |
| 2006/0291029 A1 | 12/2006 | Lin et al. |
| 2008/0237828 A1 | 10/2008 | Wang |
| 2009/0236686 A1 | 9/2009 | Shim |
| 2009/0302484 A1 | 12/2009 | Lee et al. |
| 2010/0052135 A1 | 3/2010 | Shim et al. |
| 2010/0167471 A1 | 7/2010 | Jin et al. |
| 2010/0195299 A1 | 8/2010 | Souriau et al. |
| 2010/0244208 A1 | 9/2010 | Pagaila |
| 2010/0308474 A1 | 12/2010 | Shibuya et al. |
| 2011/0001215 A1 | 1/2011 | Lam |
| 2011/0042796 A1 | 2/2011 | Chang et al. |
| 2011/0095413 A1 | 4/2011 | Barth et al. |
| 2011/0156250 A1 | 6/2011 | Goh et al. |
| 2011/0183464 A1 | 7/2011 | Takahashi |
| 2011/0186977 A1 | 8/2011 | Chi et al. |
| 2011/0193205 A1 | 8/2011 | Hsieh |
| 2011/0202896 A1 | 8/2011 | Scanlan et al. |
| 2011/0250396 A1 | 10/2011 | Matsutani et al. |
| 2012/0032314 A1 | 2/2012 | Chen et al. |
| 2012/0056312 A1 | 3/2012 | Pagaila |
| 2012/0104562 A1 | 5/2012 | Pagaila |
| 2012/0119373 A1 | 5/2012 | Hunt |
| 2012/0133001 A1 | 5/2012 | Tkaczyk et al. |
| 2012/0273959 A1 | 11/2012 | Park |
| 2012/0273960 A1 | 11/2012 | Park |
| 2013/0001762 A1 | 1/2013 | Chi |
| 2013/0026658 A1 | 1/2013 | Chen |
| 2013/0062760 A1 | 3/2013 | Hung et al. |
| 2013/0075924 A1 | 3/2013 | Lin et al. |
| 2013/0168848 A1 | 7/2013 | Lin et al. |
| 2013/0168849 A1 | 7/2013 | Scanlan |
| 2013/0270682 A1 | 10/2013 | Hu |
| 2013/0307140 A1 | 11/2013 | Huang et al. |
| 2013/0334698 A1 | 12/2013 | Mohammed et al. |
| 2014/0042600 A1 | 2/2014 | Kim et al. |
| 2014/0054802 A1 | 2/2014 | Shim |
| 2014/0057394 A1 | 2/2014 | Ramasamy et al. |
| 2014/0070403 A1 | 3/2014 | Pan |
| 2014/0077361 A1 | 3/2014 | Lin |
| 2014/0252646 A1 | 9/2014 | Hung |
| 2014/0264905 A1 | 9/2014 | Lee |
| 2014/0264930 A1 | 9/2014 | Yu |
| 2015/0145128 A1 | 5/2015 | Pagaila |
| 2016/0071820 A1 | 3/2016 | Yu |
| 2016/0093580 A1* | 3/2016 | Scanlan .................. H01L 24/02 |
| | | 438/114 |
| 2016/0218089 A1 | 7/2016 | Lee |
| 2016/0260682 A1* | 9/2016 | Scanlan .................. H01L 21/52 |
| 2016/0315071 A1 | 10/2016 | Zhai |
| 2016/0329257 A1 | 11/2016 | Scanlan et al. |
| 2017/0077022 A1 | 3/2017 | Scanlan |
| 2017/0148755 A1* | 5/2017 | Scanlan .............. H01L 21/6835 |
| 2018/0061741 A1 | 3/2018 | Beyne |
| 2018/0061809 A1 | 3/2018 | Chiu |
| 2018/0108606 A1 | 4/2018 | Scanlan |
| 2018/0190514 A1 | 7/2018 | Baloglu |
| 2018/0294229 A1 | 10/2018 | Hu |
| 2018/0330966 A1 | 11/2018 | Scanlan |
| 2019/0035767 A1 | 1/2019 | Yu |
| 2019/0088621 A1 | 3/2019 | Yang |
| 2019/0244947 A1 | 8/2019 | Yu |
| 2020/0273829 A1 | 8/2020 | Hsu |
| 2020/0294938 A1 | 9/2020 | Jain |
| 2020/0328173 A1 | 10/2020 | Yu |
| 2020/0402941 A1 | 12/2020 | Olson |
| 2021/0020605 A1 | 1/2021 | Hiner |
| 2021/0035911 A1 | 2/2021 | Ganesan |
| 2021/0090983 A1 | 3/2021 | Lin |
| 2021/0366873 A1 | 11/2021 | Gandhi |
| 2022/0028791 A1 | 1/2022 | Choi |
| 2022/0157740 A1 | 5/2022 | Verhaverbeke |
| 2022/0246532 A1 | 8/2022 | Sandstrom |
| 2022/0367466 A1 | 11/2022 | Yu |

FOREIGN PATENT DOCUMENTS

| | | |
|---|---|---|
| JP | 3255970 A | 11/1991 |
| WO | WO2009006284 | 1/2009 |
| WO | WO2009009436 | 1/2009 |
| WO | WO2010/080068 A1 | 7/2010 |
| WO | 2014182962 | 11/2014 |

OTHER PUBLICATIONS

Kripesh, Vaidyanathan et al., Design and Development of a Multi-Die Embedded Micro Wafer Level Package, Institute of Microelectronics, Singapore, 2008.

Micronews, Fan-in WLCSP matures, what's next?, 3 D Packaging Magazine, Issue 14, Feb. 2008, pp. 2-5.

Th, E.K. et al, Encapsulation Challenges for Wafer Level Packaging, Electronics Packaging Technology Conference,.

R Anderson, et al., Advances in WLCSP Technologies for Growing Market Needs, SMTA's 6th AMual International Wafer Level Packaging Conference, Oct. 27-30, 2009, Santa Clara, CA.

Kanth et al., Design and Development of True-CSP, United Test & Assembly Center Ltd (UTAC).

Hunt, John, Value Engineered Wafer Level Packages for Mobile Devices, Jul. 9, 2013.

Fan et al., Design and optimization of thermo-mechanical reliability in wafer level packaging, Jul. 4, 2009.

Motohashi et al., System in Wafer-Level Package Technology with RDL-first Process, Kanagawa, Japan.

Nishio, 3D package technologies review with gap analysis for mobile application requirements, STATS ChipPAC, Japan, Apr. 22, 2014.

Krohnert et al., System-in-package (SiP) on wafer level, enabled by fan-out WLP (eWLB), Portugal.

Flack et al., Lithography Technique to Reduce the Alignment Errors from Die Placement in Fan-out Wafer Level Packaging Applications, San Jose, CA.

Exposed, Merriam-Webster, merriam-webster.com/dictionary/exposed.

Thick Copper(Cu) RDL, Chipbond website.

Yannou, An overview of recent panel-scale packaging developments throughout the industry, MiNaPAD conference, Grenoble, Apr. 24, 2012.

(56) References Cited

OTHER PUBLICATIONS

WLCSP (FiWLP Technology), Wafer level chip scale package.

* cited by examiner

STACKABLE FULLY MOLDED SEMICONDUCTOR STRUCTURE WITH VERTICAL INTERCONNECTS

CROSS-REFERENCE TO RELATED APPLICATIONS

This disclosure is a continuation of U.S. Utility patent application Ser. No. 16/904,404, entitled "Stackable Fully Molded Semiconductor Structure with Vertical Interconnects," which was filed Jun. 17, 2020, and issues as U.S. Pat. No. 11,056,453 on Jul. 6, 2021, which claims the benefit, including the filing date, of U.S. Provisional Patent No. 62/863,179, entitled "Stackable Fully Molded Semiconductor Structure with Vertical Interconnects," which was filed on Jun. 18, 2020, the disclosures of which are hereby incorporated herein by this reference.

TECHNICAL FIELD

The disclosure relates to a fully molded semiconductor package and method of making the same, which includes a peripheral area around a semiconductor die comprising vertically oriented electrical interconnects that facilitate of package on package (PoP) stacking of multiple semiconductor packages.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, can be produced more efficiently, have a smaller form factor, and may be less cumbersome when integrated within wearable electronics, portable handheld communication devices, such as phones, and in other applications. In other words, smaller semiconductor devices may have a smaller footprint, a reduced height, or both, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

On opportunity exists for improved semiconductor manufacturing. Accordingly, in an aspect of the disclosure, a method of making a semiconductor device may comprise providing a carrier, and forming a planar conductive seed layer over the carrier. A first photoresist may be formed over the carrier and the seed layer. The first photoresist layer may be patterned to form first openings through the first photoresist that extend to the planar conductive seed layer. A non-planar conductive seed layer may be formed over the first photoresist that conformally extends into the first openings through the first photoresist. A second photoresist may be formed over the first photoresist, within the first openings, and over the non-planar conductive seed layer. The second photoresist layer may be patterned to form second openings through the second photoresist that align with the first openings and extend to the non-planar conductive seed layer. Copper posts may be plated over the non-planar conductive seed layer and within the first openings and the second openings. The second photoresist may be stripped while leaving in place the first photoresist. A semiconductor die may be coupled to the carrier in a face up orientation, with a die attach film coupled to the carrier and disposed between the backside of the semiconductor die and the carrier. The semiconductor die and a portion of the copper posts exposed from the first photoresist may be encapsulated with mold compound. A conductive redistribution layer (RDL) may be formed over the mold compound and coupled with first ends of the copper posts and the active surface of the semiconductor die. The carrier and the second photoresist may be removed after encapsulating the semiconductor with the mold compound to expose second ends and adjacent sides of the copper posts. Conductive bumps may be formed over exposed second ends and adjacent sides of the copper posts.

Particular embodiments of the method of making the semiconductor device may further comprise providing the carrier as a reusable carrier, forming a release layer over the reusable carrier, and removing the carrier by activating the release layer. The planar conductive seed layer may be formed of TiCu and over the release layer, and the TiCu planar conductive seed layer may be used as a protective barrier for the release layer before removing the carrier by activating the release layer. The copper posts may comprise a step along a sidewall of the copper posts formed where the first photoresist layer meets the second photoresist layer within the second opening. The carrier and the second photoresist may be removed after encapsulating the semiconductor with the mold compound to form a recessed portion of a bottom surface of the mold compound. A rim of mold compound may be formed with a width of 10-100 μm around a periphery of the semiconductor die and adjacent to the recessed portion of the bottom surface of the mold compound. A package on package (POP) structure may be formed by coupling a first semiconductor device over a second semiconductor device.

According to an aspect of the disclosure, the method of making the semiconductor device may further comprise providing a carrier and forming a first photoresist over the carrier with first openings through the first photoresist. A non-planar conductive seed layer may be formed over the first photoresist that conformally extends into the first openings through the first photoresist. A second photoresist may be formed over the first photoresist and over the non-planar conductive seed layer. The second photoresist layer may be formed to form second openings through the second photoresist and extend to the non-planar conductive seed layer. Conductive posts may be plated over the non-planar conductive seed layer and within the second openings. The second photoresist may be removed while leaving in place the first photoresist. A semiconductor die may be coupled to the carrier. The semiconductor die, the conductive posts, and the first photoresist may be encapsulated with mold compound.

In another aspect, particular embodiments of the method of making a semiconductor device can comprise conductive posts plated over the non-planar conductive seed layer and within the second openings. The carrier and the second photoresist may be removed after encapsulating the semiconductor with the mold compound to form a recessed portion of a bottom surface of the mold compound, and a rim of mold compound may be formed around a periphery of the semiconductor die and adjacent the recessed portion of the bottom surface of the mold compound. The conductive posts may be plated over the non-planar conductive seed layer and outside of, and offset from, the second openings. Conductive bumps may be formed over exposed ends and adjacent sides of the conductive posts. The conductive posts may comprise a step along a sidewall of the conductive posts formed where the first photoresist layer meets the second photoresist layer within the second opening.

According to an aspect of the disclosure, the method of making the semiconductor device may further comprise providing a semiconductor die, forming conductive posts in a periphery of the semiconductor die, and encapsulating the semiconductor die and the conductive posts with an encapsulant such that at least one end of the conductive posts are made to be offset with respect to the encapsulant by removing a photoresist layer.

In another aspect, particular embodiments of the method of making a semiconductor device may comprise forming the photoresist layer as a first photoresist layer over a carrier, forming a seed layer over the first photoresist, forming a second photoresist over the first photoresist and with openings over the seed layer, forming the conductive posts within the second openings, and stripping the second photoresist while leaving in place the first photoresist before encapsulating the semiconductor die. First openings may be formed through the first photoresist, and the second openings may be formed within the first openings and extend to the seed layer. The seed layer may conformally extend into the first openings. Conductive bumps may be formed over exposed ends and adjacent sides of the conductive posts. A recessed portion of a bottom surface of the encapsulant may be formed, and a rim of encapsulant may be formed around a periphery of the semiconductor die and adjacent the recessed portion of the bottom surface of encapsulant. The conductive posts may be plated over the non-planar conductive seed layer and outside of, and offset from, the second openings.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that he can be his own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35

U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

DETAILED DESCRIPTION

Figure 1A:
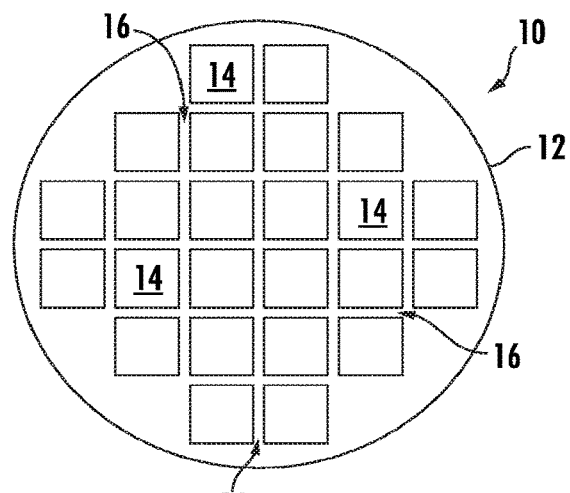
FIGS. 1A-1C illustrate semiconductor die from a native wafer comprising electrical interconnects.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, such as by a stripping process, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

FIG. 1A shows a plan view of a semiconductor wafer or native wafer 10 with a base substrate material 12, such as, without limitation, silicon, germanium, gallium arsenide, indium phosphide, or silicon carbide, for structural support. A plurality of semiconductor die or components 14 can be formed on wafer 10 separated by a non-active, inter-die wafer area or saw street 16 as described above. The saw street 16 can provide cutting areas to singulate the semiconductor wafer 10 into the individual semiconductor die 14.

Figure 1B:
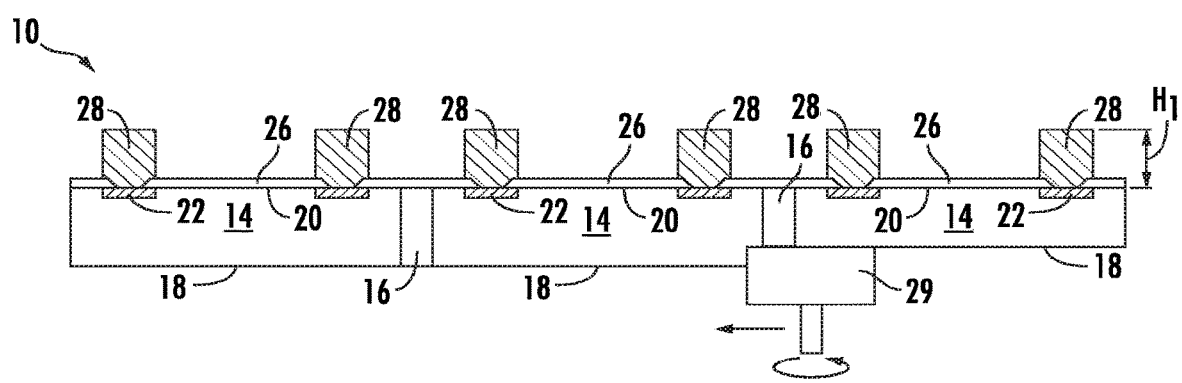

FIG. 1B shows a cross-sectional profile view of a plurality of semiconductor die 14 from the native wafer 10, show in FIG. 1A. Each semiconductor die 14 has a backside or back surface 18 and an active surface 20 opposite the backside 18. Active surface 20 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuit. Semiconductor die 14 may also contain IPDs such as inductors, capacitors, and resistors, for RF signal processing.

An electrically conductive layer 22 is formed over active surface 20 using PVD, CVD, electrolytic plating, electroless plating process, or other suitable metal deposition process. Conductive layer 22 can be one or more layers of aluminum (Al), copper (Cu), Sn, nickel (Ni), gold (Au), silver (Ag), or other suitable electrically conductive material. Conductive layer 22 can be, or operate as, contact pads or bond pads electrically coupled or connected to the circuits on active surface 20. Conductive layer 22 can be formed as contact pads disposed side-by-side a first distance from the edge of semiconductor die 14, as shown in FIG. 1B. Conductive layer 22 can also be formed as contact pads that are offset in multiple rows such that a first row of contact pads is disposed a first distance from the edge of the die, and a second row of contact pads alternating with the first row is disposed a second distance from the edge of the die. Additionally, conductive layer 22 can be formed as contact pads that are arranged as a full array of pads distributed over the active area of the semiconductor die or chip. In some instances the contact pads can be arranged in an irregular or asymmetrical array with differing or various spacing among the contact pads.

FIG. 1B also shows an optional insulating or passivation layer 26 conformally applied over active surface 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, semiconductor die 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1B also shows conductive bumps, conductive interconnects, or electrical interconnect structures 28 that can be formed as columns, pillars, posts, thick RDLs, bumps, or studs that are formed of copper or other suitable conductive material, which are disposed over, and coupled or connected to, conductive layer 22. When formed as posts 28, the posts will have a height greater than a thickness, whereas a pillar has a tin cap and a stud is wider than it is tall. Conductive bumps 28 can be formed directly on conductive layer 22 using patterning and metal deposition processes such as printing, PVD, CVD, sputtering, electrolytic plating, electroless plating, metal evaporation, metal sputtering, or other suitable metal deposition process. Conductive bumps 28 can be one or more layers of Al, Cu, Sn, Ni, Au, Ag, palladium (Pd), or other suitable electrically conductive material and can include one or more layers. In some instances, one or more UBM layers of Al, Cu, Sn, Ni, Au, Ag, Pd, or other suitable electrically conductive material can optionally be disposed between conductive layer 22 and conductive bumps 28. In some embodiments, conductive bumps 28 can be formed by depositing a photoresist layer over the semiconductor die 14 and conductive layer 22 while the semiconductor die 14 are part of the semiconductor wafer 10. A portion of the photoresist layer can be exposed and removed by an etching development process, and the conductive bumps 28 can be formed as copper pillars in the removed portion of the photoresist and over conductive layer 22 using a selective plating process. The photoresist layer can be removed leaving conductive bumps 28 that provide for subsequent mechanical and electrical interconnection and a standoff with respect to active surface 20. Conductive bumps 28 can include a height H1 in a range of 5-100 micrometers (μm) or a height in a range of 20-50 μm, or a height of about 25 μm.

FIG. 1B also shows the semiconductor wafer 10 can undergo an optional grinding operation with a grinder 29 to planarize the surface and reduce a thickness of the semiconductor wafer 10. A chemical etch can also be used to remove and planarize a portion of the semiconductor wafer 10.

Figure 1C:
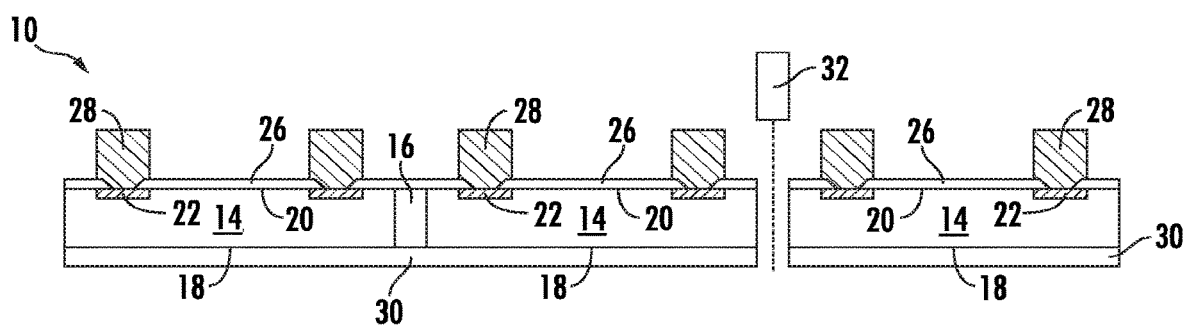

FIG. 1C shows attaching a die attach film (DAF) 30 to the semiconductor wafer 10 that can be disposed over, and in direct contact with, the backsides 18 of the semiconductor die 14. The DAF 30 can comprise epoxy, thermal epoxy, epoxy resin, B-stage epoxy laminating film, ultraviolet (UV) B-stage film adhesive layer, UV B-stage film adhesive layer including acrylic polymer, thermo-setting adhesive film layer, a suitable wafer backside coating, epoxy resin with organic filler, silica filler, or polymer filler, acrylate based adhesive, epoxy-acrylate adhesive, a polyimide (PI) based adhesive, or other adhesive material.

FIG. 1C also shows semiconductor wafer 10 can be singulated through gaps or saw streets 16 using laser grooving, a saw blade or laser cutting tool 32, or both to singulate the semiconductor wafer 10 into individual semiconductor die 14 with conductive bumps 28. The semiconductor die 14 can then be used as part of a subsequently formed semiconductor component package as discussed in greater detail below with respect to FIGS. 2A-4F.

Figure 2A:
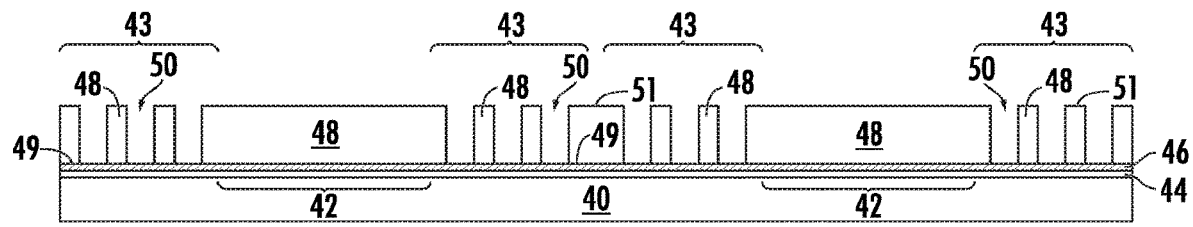
FIGS. 2A-2L illustrate the formation of fully molded peripheral PoP devices.

FIG. 2A shows providing a carrier or substrate 40, on which subsequent processing of the semiconductor devices, semiconductor component packages, or fully-molded peripheral PoP devices or packages 100 can occur, as described in greater detail herein. Carrier 40 may be a temporary or sacrificial carrier or substrate, and in other instances may be or a reusable carrier or substrate.

The carrier 40 can contain one or more base materials formed in one or more layers, which may comprise base materials such as metal, silicon, polymer, polymer composite, ceramic, perforated ceramic, glass, glass epoxy, stainless steel, mold compound, mold compound with filler, or other suitable low-cost, rigid material or bulk semiconductor material for structural support. When a UV release is used with a temporary carrier 40, the carrier 40 may comprise one or more transparent or translucent materials, such as glass. When a thermal release is used with a temporary carrier 40, the carrier 40 may comprise opaque materials. The carrier 40 can be circular, square, rectangular, or other suitable or desirable shape and can include any desirable size, such as a size equal to, similar to, or slightly larger or smaller than a reconstituted wafer or panel that is subsequently formed on or over the carrier 40. In some instances, a diameter, length, or width of the temporary carrier can be equal to, or about, 200 millimeters (mm), 300 mm, or more.

The carrier 40 can comprise a plurality of semiconductor die mounting sites or die attach areas 42 spaced or disposed across a surface of the carrier 40, according to a design and configuration of the final semiconductor devices 100, to provide a peripheral area or space 43. The peripheral area 43 can partially or completely surround the die attach areas 42 to provide space for subsequent vertical, through package interconnections, and an area for fan-out routing or build-up interconnect structures.

When a temporary carrier 40 is used, an optional release layer, interface layer or double-sided tape 44 can be formed over carrier 40 as a temporary adhesive bonding film or etch-stop layer. The release layer 44 may be a film or laminate, and may also be applied by spin coating or other suitable process. The temporary carrier can be subsequently removed by strip etching, chemical etching, mechanical peel-off, CMP, plasma etching, thermal, light releasing process, mechanical grinding, thermal bake, laser scanning, UV light, or wet stripping. While the release layer 44 is shown in FIG. 2A, for convenience and simplicity, the optional release layer 44 has been omitted from subsequent FIGs. although a person of ordinary skill will understand that the release layer 44 can remain and be present in processing shown in the other FIGs.

FIG. 2A also shows forming a seed layer 46 over the carrier 40 and the release layer 44, when present, so that the seed layer 46 can be in direct contact with the surface of the carrier 40, or in direct contact with the release layer 44, when present. The seed layer 46 can be one or more layers of Al, Cu, Sn, Ni, Au, Ag, Titanium (Ti), Tungsten (W) or other suitable electrically conductive material. In some instances, the seed layer 46 will be, or may include, Ti/Cu, TiW/Cu, W/Cu or a coupling agent/Cu. The formation, placement, or deposition of the seed layer 46 can be with PVD, CVD, electrolytic plating, electroless plating, or other suitable process. The seed layer 46 can be deposited by sputtering, electroless plating, or by depositing laminated foil, such as Cu foil, combined with electroless plating.

FIG. 2A also shows forming or depositing a resist layer or photosensitive layer 48 over the temporary carrier 40. After formation of the resist layer 48 over the temporary carrier, the resist layer 48 can then be exposed and developed to form openings 50 in the resist layer 48. As discussed in greater detail below, in some instances more than one photoresist layer 48, such as a first photoresist layer 48a and a second photoresist layer 48b may be used. Openings 50 may be formed in the photoresist 48, and can be positioned over, or within a footprint of, the peripheral area 43 of the carrier 40. As discussed in greater detail below, in some instances more than one opening or set of openings 50 may be formed, such as first openings 50a formed in photoresist layer 48a, and second openings 50b formed in second photoresist layer 48b. The openings 50 can extend completely through the resist layer 48, such as from a first surface or bottom surface 49 of the resist layer 48 to second surface or top surface 51 of the resist layer 48 opposite the first surface 49. An after development inspection (ADI) of the developed resist layer 48 and the openings 50 can be performed to detect the condition or quality of the openings 50. After the ADI of resist layer 48 and openings 50, a descum operation can be performed on the developed resist layer 48.

Figure 2B:
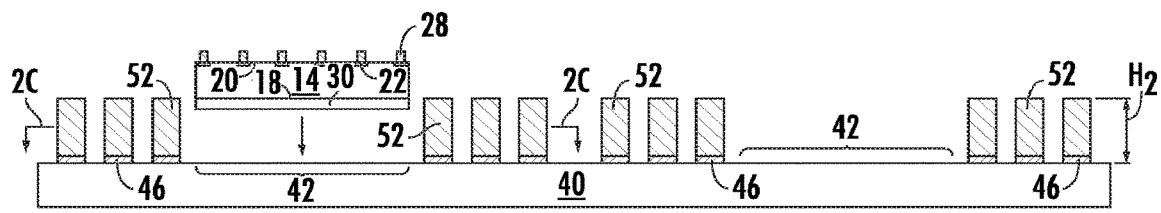

FIG. 2B shows the formation of a plurality of conductive interconnects 52 within the resist layer 48 that can be formed as columns, pillars, posts, bumps, or studs that are formed of copper or other suitable conductive material. Conductive interconnects 52 can be formed using patterning and metal deposition processes such as printing, PVD, CVD, sputtering, electrolytic plating, electroless plating, metal evaporation, metal sputtering, or other suitable metal deposition process. When conductive interconnects 52 are formed by plating, the seed layer 46 can be used as part of the plating process. Conductive interconnects of posts 52 can be one or more layers of Al, Cu, Sn, Ni, Au, Ag, Pd, solder, or other suitable electrically conductive material and can include one or more layers.

After formation of the conductive interconnects 52, the resist layer 48 can be removed, such as by a stripping process, leaving conductive interconnects 52 in the peripheral area 43 around the semiconductor die mounting sites 42 to provide for subsequent vertical or three dimensional (3D) electrical interconnection for the semiconductor devices 100. Conductive interconnects 52 can include a height H2 in a range of 80-300 μm or a height in a range of 100-150 μm, or a height thereabout. In other instances, conductive vertical interconnects 52 may include a height in a range of 10-600 μm, 60-100 μm, 70-90 μm, or about, 80 μm. As used herein, "thereabout," "about," or "substantially" means a percent difference in a range of 0-5%, 1-10%, 1-20%, or 1-30%.

After removal of the resist layer 48, or at least one photoresist layer such as 48b, the semiconductor die mounting sites 42 on or over the temporary carrier 40 can be exposed and ready to receive the semiconductor die 14. The orientation of semiconductor die 14 can be either face up with active surface 20 oriented away from the temporary carrier 40 to which the semiconductor die 14 are mounted, or alternatively can be mounted face down with the active surface 20 oriented toward the temporary carrier 40 to which the semiconductor die 14 are mounted. After mounting the semiconductor die 14 to the temporary carrier 40 in a face up orientation, the DAF 30 can undergo a curing process to cure the DAF 30 and to lock the semiconductor die 14 in place over the temporary carrier 40.

Alternatively, preformed conductive vertical interconnects 52 may be formed away from the carrier 40, may be placed over the carrier 40 after formation, such as with a pick and place operation. In some instances, the conductive vertical interconnects 52 may be part of larger frame (whether integrally or separately formed with the conductive vertical interconnects) with connecting members to maintain a desired spacing or position of the conductive vertical interconnects. In some instances, the conductive vertical interconnects 52 may be in contact with, surrounded by, or encapsulated or molded with an encapsulant or mold compound that may the same, similar, or different than the encapsulant 56 disposed around the semiconductor die 14.

Figure 2C:
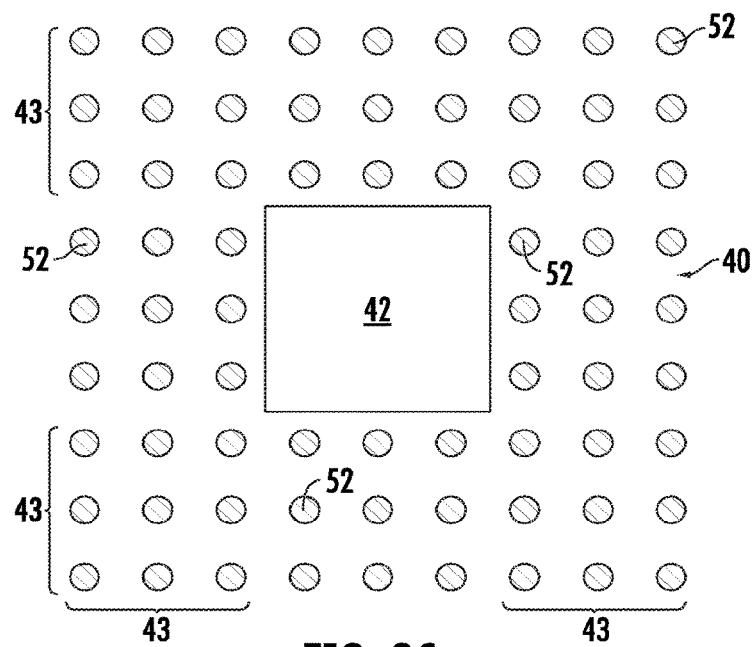

FIG. 2C shows a top or plan view of a portion of the temporary carrier 40 and the conductive interconnects 52 taken along the section line 2C from FIG. 2B. FIG. 2C shows that the conductive interconnects 52 can be formed within, and extend intermittently across, the peripheral area 43 and surround the semiconductor die mounting sites 42 without being formed within the semiconductor die mounting sites 42.

Figure 2D:
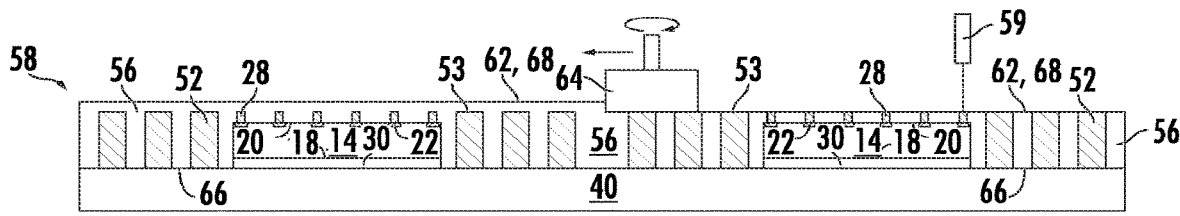

FIG. 2D shows that after mounting the semiconductor die 14 to the carrier 40, a mold compound or encapsulant 56 can be deposited around the plurality of semiconductor die 14 using a paste printing, compression molding, transfer molding, liquid encapsulant molding, lamination, vacuum lamination, spin coating, or other suitable applicator. The mold compound 56 can be a polymer composite material, such as epoxy resin with filler, epoxy acrylate with filler, PBO, polyimide, polymer with or without proper filler. Semiconductor die 14 can be embedded in mold compound 56, which can be non-conductive and environmentally protect the semiconductor die 14 from external elements and contaminants. The mold compound 56 can be formed adjacent to and directly contact all lateral sides of the semiconductor die (such as four sides), as well as be formed over the active surface 20 of the semiconductor die 14. The mold compound 56 can also be formed around and directly contact the sides of the conductive bumps 28 and the conductive interconnects 52 to form a reconstituted panel, reconstituted wafer, molded panel, or molded wafer 58.

The reconstituted panel 58 can optionally undergo a curing process or post mold cure (PMC) to cure the mold compound 56. In some instances, a top surface, front surface, or first surface 62 of the mold compound 56 can be substantially coplanar with first end 53 of the conductive interconnects 52. Alternatively, the top surface 62 of the mold compound 56 can be over, offset, or vertically separated from the first ends 53 of the conductive interconnects 52, such that the first ends 53 of the conductive interconnects 52 are exposed with respect to the encapsulant 56 after the reconstituted wafer 58 undergoes a grinding operation.

The reconstituted panel 58 can also undergo an optional grinding operation with grinder 64 to planarize the top surface, front surface, or first surface 68 of the reconstituted panel 58 and to reduce a thickness of the reconstituted panel 58, and to planarize the top surface 62 of the mold compound 56 and to planarize the top surface 68 of the reconstituted panel 58. The top surface 68 of the reconstituted panel 58 can comprise the top surface 62 of the mold compound 56, the first ends of the conductive interconnects 52, or both. A chemical etch can also be used to remove and planarize the mold compound 56 and the reconstituted panel 58. Thus, the top surface 68 of the conductive interconnects 52 can be exposed with respect to mold compound 56 in the peripheral area 43 to provide for electrical connection between semiconductor die 14 and a subsequently formed redistribution layer or build-up interconnect structure 70.

The reconstituted wafer 58 can also undergo a panel trim or trimming to remove excess mold compound 56 that has remained in undesirable locations as a result of a molding process, such as eliminating a flange present for a mold chase. The reconstituted panel 58 can include a footprint or form factor of any shape and size including a circular, rectangular, or square shape, the reconstituted wafer 58 comprising a diameter, length, or width of 200 millimeter (mm), 300 mm, or any other desirable size.

FIG. 2D also shows that actual positions of the semiconductor die 14 within the reconstituted panel 58 may be measured with an inspection device or optical inspection device 59. As such, subsequent processing of the fully molded panel 58 as shown and described with respect to subsequent FIGs. can be performed with respect to the actual positions of the semiconductor die 14 within the reconstituted panel 58.

Figure 2E:
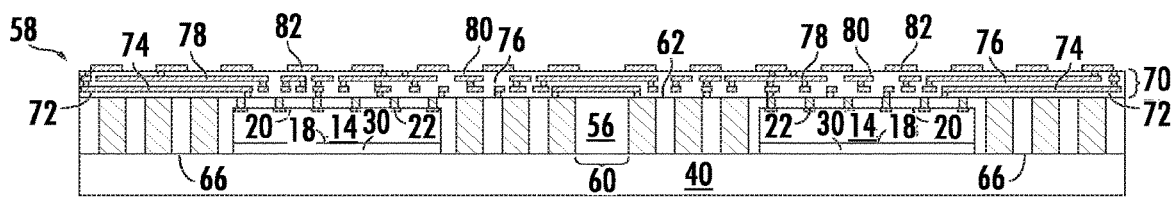

FIG. 2E shows forming a build-up interconnect structure 70 over the molded panel 58 to electrically connect, and provide routing between, conductive interconnects 52 and the conductive bumps 28. While the build-up interconnect structure 70 is shown comprising three conductive layers and three insulating layer, a person of ordinary skill in the art will appreciate that fewer layers or more layers can be used depending on the configuration and design of the semiconductor device 100. The build-up interconnect structure 70 can optionally comprise a first insulating or passivation layer 72 formed or disposed over the reconstituted panel 58. The first insulating layer 72 can comprise one or more layers of $SiO_2$, $Si_3N_4$, SiON, $Ta_2O_5$, $Al_2O_3$, polymer, polyimide, BCB, PBO, or other material having similar insulating and structural properties. The insulating layer 72 can be formed using PVD, CVD, printing, spin coating, spray coating, sintering or thermal oxidation. Openings or first level conductive vias can be formed through the insulating layer 72 over the conductive interconnects 52 and the conductive bumps 28 to connect with the semiconductor die 14.

A first conductive layer 74 can be formed over the reconstituted panel 58 and over the first insulating layer 72 as a first RDL layer to extend through the openings in the first insulating layer 72, to electrically connect with the first level conductive vias, and to electrically connect with the conductive bumps 28 and the conductive interconnects 52. Conductive layer 74 can be one or more layers of Al, Cu, Sn, Ni, Au, Ag, or other suitable electrically conductive material formed using a patterning and metal deposition process such as sputtering, electrolytic plating, and electroless plating, or other suitable process.

A second insulating or passivation layer 76, which can be similar or identical to the first insulating layer 72, can be disposed or formed over the reconstituted panel 58, the first conductive layer 74, and the first insulating layer 72. An opening or second level conductive via can be formed through the second insulating layer 76 to connect with the first conductive layer 74.

A second conductive layer 78, when desirable and when present, may be similar or identical to the first conductive layer 74, can be formed as a second RDL layer over reconstituted panel 58, over the first insulating layer 72, over the first conductive layer 74, over the second level conductive via, or within an opening of the second insulating layer 72, to electrically connect with the first conductive layer 74, the first level and second level conductive vias, and the semiconductor die 14.

A third insulating or passivation layer 80, when desirable and when present, may be similar or identical to the first insulating layer 72, can be disposed or formed over the second conductive layer 78 and the second insulating layer 76. An opening or a third level conductive via can also be formed in or through the third insulating layer 80 to connect with the second conductive layer 78.

A third conductive layer or UBMs 82 can be formed over the third insulating layer 80 and the third level conductive via to electrically connect with the other conductive layers and conductive vias within the build-up interconnects structure 70, as well as electrically connect to the semiconductor die 14, the conductive bumps 28, and the conductive interconnects 52. UBMs 82, like all of the layers, plating layers, or conductive layers formed by a plating process as presented herein, can be a multiple metal stack comprising one or more of an adhesion layer, barrier layer, seed layer, or wetting layer. The adhesion layer can comprise titanium (Ti), or titanium nitride (TiN), titanium tungsten (TiW), Al, or chromium (Cr). The barrier layer can be formed over the adhesion layer and can be made of Ni, NiV, platinum (Pt), palladium (Pd), TiW, or chromium copper (CrCu). In some instances the barrier layer can be a sputtered layer of TiW or Ti and can serve as both the adhesion layer and the barrier layer. In either event, the barrier layer can inhibit unwanted diffusion of material, like Cu. The seed layer can be Cu, Ni, NiV, Au, Al, or other suitable material. For example, the seed layer can be a sputtered layer of Cu comprising a thickness of about 2000 angstroms (e.g., 2000 plus or minus 0-600 angstroms). The seed layer can be formed over the barrier layer and can act as an intermediate conductive layer below subsequently formed bumps, balls, or interconnect structures 94. In some instances, the wetting layer can comprise a layer of Cu with a thickness in a range of about 5-11 μm or 7-9 μm. Bumps 94, such as when formed of SnAg solder, can consume some of the Cu UBM during reflow and forms an intermetallic compound at the interface between the solder bump 94 and the Cu of the wetting layer. However, the Cu of the wetting layer can be made made thick enough to prevent full consumption of the Cu pad by the solder during high temperature aging.

Figure 2F:
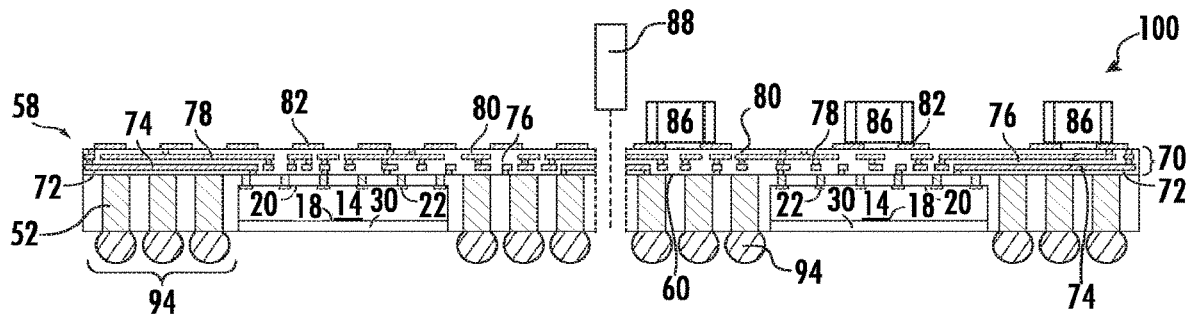

UBMs 82 may be formed as a PoP UBM pad, UBM structure, or land pad, such as for stacked PoP structure, an additional electronic component, as well as for a surface mount structure 86, such as a any active or passive semiconductor devices, chip, or integrated circuit passive device, including, e.g., a capacitor. In some instances, the UBMs 82 can comprise Ni, Pd and Au. UBMs 82 can provide a low resistive interconnect to build-up interconnect structure 70 as well as a barrier to solder diffusion and seed layer for solder wettability. FIG. 2F shows an example of capacitors 86 coupled to UBMs 82 as part of the semiconductor device 100.

FIG. 2F shows removing the temporary carrier 40, to expose the second ends 54 of the conductive interconnects 52. The carrier 40 can be removed, e.g., by grinding the carrier 40, by exposing UV release tape 44 to UV radiation separate the UV tape 44 from the glass substrate 40, by thermal release, or other suitable method. After removal of the carrier 40, the reconstituted panel 58 can also undergo an etching process, such as a wet etch, to clean the surface of the reconstituted panel 58 exposed by removal of the temporary carrier 40, including the exposed second ends 54 of the conductive interconnects 52. The exposed second ends 54 of the conductive interconnects 52 can also undergo a coating or pad finishing process, such as by an Organic Solderability Preservative (OSP) coating, solder printing, electroless plating, or other suitable process, to form a PoP UBM pad, UBM structures, land pads, or other suitable structure, as desired.

Bumps, balls, or interconnect structures 94, can be formed on the exposed second ends 54 of the conductive interconnects 52. The bumps 94 can be formed by depositing an electrically conductive bump material over the exposed second ends 54 of the conductive interconnects 52 using an evaporation, electrolytic plating, electroless plating, ball drop, or screen printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material can be bonded to the exposed second ends 54 of the conductive interconnects 52 using a suitable attachment or bonding process. In one embodiment, the bump material is reflowed by heating the material above its melting point to form spherical balls or bumps 94. In some applications, bumps 94 are reflowed a second time to improve electrical contact to conductive interconnects 52. The bumps 94 can also be compression bonded or thermocompression bonded to the conductive interconnects 52. Bumps 94 represent one type of interconnect structure that can be formed over the conductive interconnects 52, and other desirable structures, such as conductive paste, stud bump, micro bump, or other electrical interconnects may also be used as desired.

FIG. 2F also shows singulation of the molded panel 58 and build-up interconnect structure 70 with saw blade or laser cutting tool 88 to form individual semiconductor devices or packages 100. The final structure may be thinner than previous packages, comprising an overall height or thickness of, or on the order of, or about, 50-100, 50-80, or less than or about 100 μm. Stacks of multiple layers can be correspondingly thicker, and increase in multiples of the above ranges, resulting in an overall thickness in a range of 200-1,000 μm. As part of the reduced height of the structure, the final structure may be made without an interposer, comprising the build-up interconnect layers and conductive vertical providing the function of an interposer, and serving as s sort of embedded interposer.

Figure 2G:
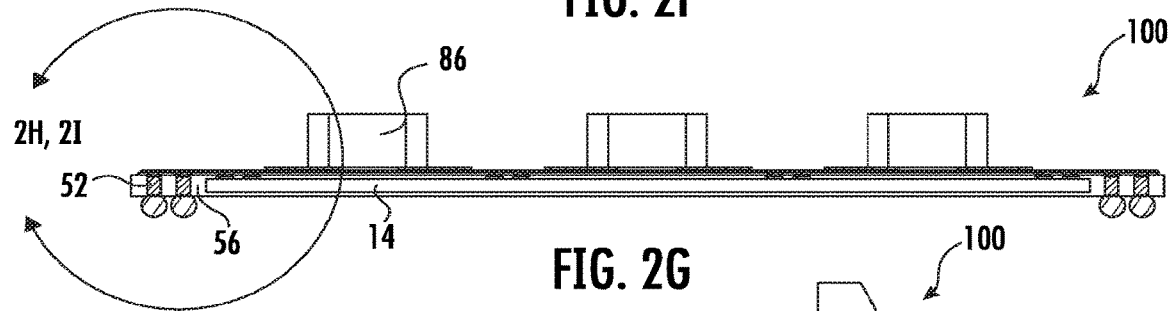

FIG. 2G shows a cross-sectional profile view of a final semiconductor device 100, similar to the view shown in FIG. 2F, but with the view in FIG. 2G shown with the features of the device 100 more closely to scale. FIG. 2G shows the peripheral conductive interconnect structures 52 disposed around, and laterally offset from, the semiconductor die 14 and within the encapsulant material 56. The peripheral conductive interconnect structures 52 can extend completely through the encapsulant 56 in a vertical direction from the top surface 62 of the encapsulant 56 to, or adjacent, the bottom surface 66 of the encapsulant 56 opposite top surface 62 to provide vertical electrical interconnection through the semiconductor device 100, which can facilitate stacking of packages in PoP arrangements.

Figure 2H:
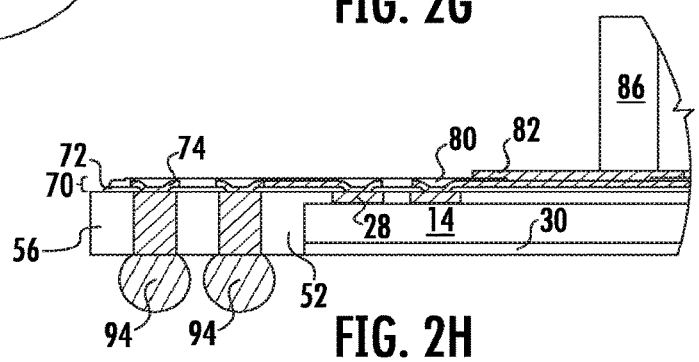
Figure 2I:
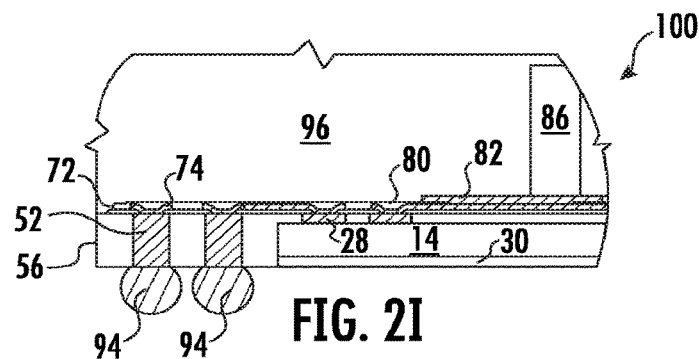

FIGS. 2H and 2I show close-up views of a portion of the cross-sectional profile view of the semiconductor device 100 shown in FIG. 2G, taken at the section line 2H-2I. FIG. 2H shows the device 100 with the surface mount device 86 exposed, and FIG. 2I shows encapsulant or mold compound 96, which is similar or identical to mold compound or encapsulant 56, disposed around the surface mount device 86. FIG. 2H shows that the backside 18 of the die 14 can comprise the DAF 30 used to attach the die 14 face-up to the temporary carrier 40 during the encapsulation process with the mold compound 56, the DAF 30 becoming a part of a final structure of the semiconductor device 100. The DAF 30 can be exposed after removal of the carrier 40, or with the removal of the carrier 40. Keeping the DAF 30 as part of the semiconductor device 100 can balance a thermal expansion mismatch at both sides 18, 20 of the semiconductor die 14, thereby reducing warpage of the package 100.

Figure 2J:
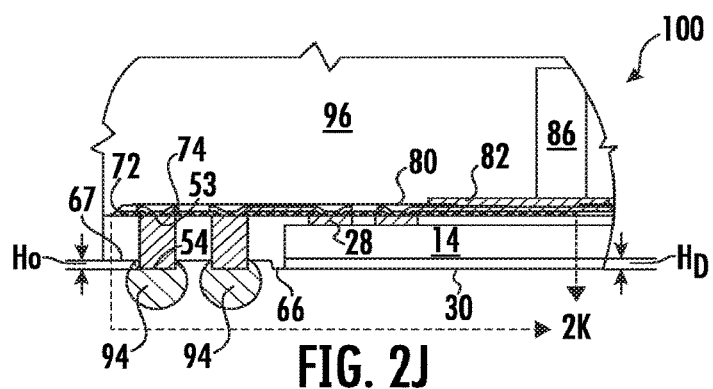

FIG. 2J shows a view of a semiconductor device 100 similar to the semiconductor device 100 shown in FIG. 2I. FIG. 2J differs from FIG. 2I with the inclusion of recessed portion 67 of the bottom surface, back surface, or second surface 66 of mold compound 56 around the second ends 54 of the conductive posts 52. A height Ho of the offset 67 may be in a range of 5-50 μm or about 25 μm, with the height Ho being the same as, or similar to, a height $H_D$ of the DAF 30.

Figure 2K:
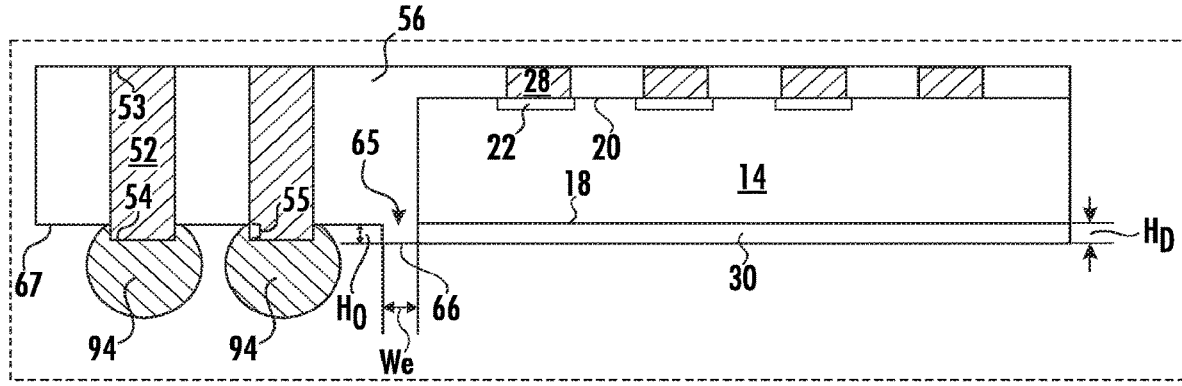

FIG. 2K shows a close-up view of a portion of FIG. 2J shown within section line 2K. FIG. 2K provides additional detail of the structure of the offset 67 and the protrusion of the second ends 54 of the conductive posts 52 from the encapsulant 56, which results in an exposed sidewall 55 of the post or conductive interconnect 52 that is not in contact with the encapsulant 56, but may be in contact with, and disposed within the bumps 94. With exposed sidewalls 55 and second ends 54 of conductive posts 52 within the bumps 94, a structural strength of the bond between the bumps 94 and the posts or conductive interconnects 52 is improved, and an overall package height of semiconductor device 100 may be reduced.

FIG. 2K also shows that a rim or edge 65 of mold compound or encapsulant 56 may contact, extend from, and wrap around the DAF 30 at the backside 18 of semiconductor die 14, and comprise a width We in a range of 10-100 µm, 20-50 µm, or about 25 µm, with the width We being the same as, or similar to, the height Ho. The structure of FIGS. 2J and 2K is further discussed with respect to the structure, method, and process shown in FIGS. 3A-3J.

Figure 2L:
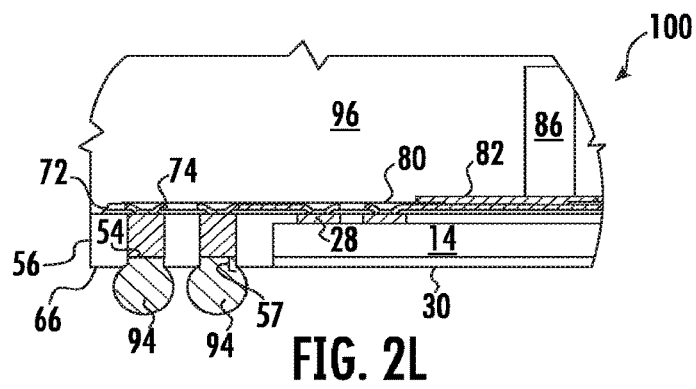

FIG. 2L shows a view of a semiconductor device 100 similar to the view of the semiconductor device 100 shown in FIG. 2J. FIG. 2L differs from FIG. 2J with the bottom surface 66 of the encapsulant 56 being level, flush, or co-planar with a bottom surface of the DAF 30. Semiconductor device 100 of FIG. 2L further comprises a recess 57 in mold compound 56 that extends from the bottom surface 66 of the encapsulant to the second end 54 of post 52. Recess 57 comprises a depth that is in a range of 5-50 µm, or about 25 µm, with the depth of recess 57 being the same as, or similar to, the height $H_D$ of the DAF 30. Recess 57 is thereby configured to receive a portion of the bump 94 within the recess 57 to reduce an overall package height of the semiconductor device 100. The structure of FIG. 2L is further discussed with respect to the structure, method, and process shown in FIGS. 3A-3F and 3J.

FIGS. 3A-3J show a process or method of forming a semiconductor device, semiconductor component package, or fully-molded peripheral PoP devices or package 100 by using one or more photoresist layers, such as a first photoresist layer 48a and a second photoresist layer 48b. A conductive seed layer 46 or second conductive seed layer 46b may be disposed between the first photoresist layer 48a and a second photoresist layer 48b.

Figure 3A:
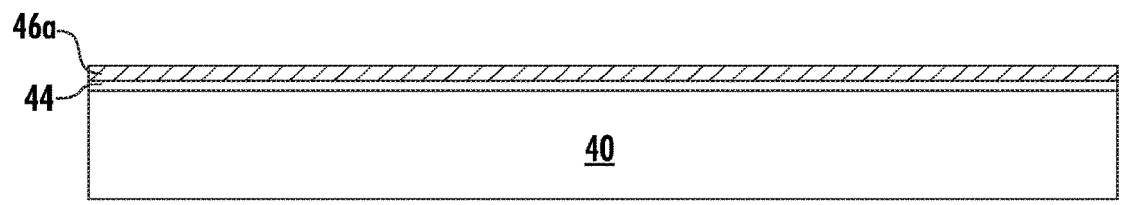
FIGS. 3A-3K illustrate the formation of fully molded peripheral PoP devices using multiple photoresists in forming the peripheral conductive posts or electrical interconnects.

FIG. 3A shows an optional release layer 44 and an optional seed layer 46 formed over a carrier 40, as described in FIG. 2A. The seed layer 46 may serve as a protective barrier for the release layer 44, when present, until the release layer is activated for removal of the carrier 40. While FIG. 2A describes the formation of openings 50 in photoresist layer 48 for the formation of conductive interconnects or posts 52, FIGS. 3B-3G show various instances in which the conductive interconnects or posts 52 may be formed with more than one photoresist 48.

Figure 3B:
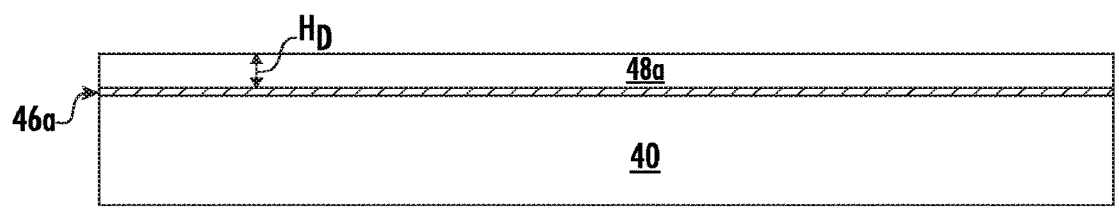

FIG. 3B shows a first planar photoresist layer 48 formed over the wafer 40, and optionally over the release layer 44 and the seed layer 46 or first seed layer 46a. A height of the first photoresist layer may be equal to a height $H_D$ of the DAF 30, such as in a range of 5-50 µm or about 10, 15, or 25 µm. Each of the photo resist layers 48, whether layer 48, 48a, or 48b, may be made of materials similar or identical to each other and formed, placed, positioned, or made with methods similar or identical to those described for each other.

Figure 3C:
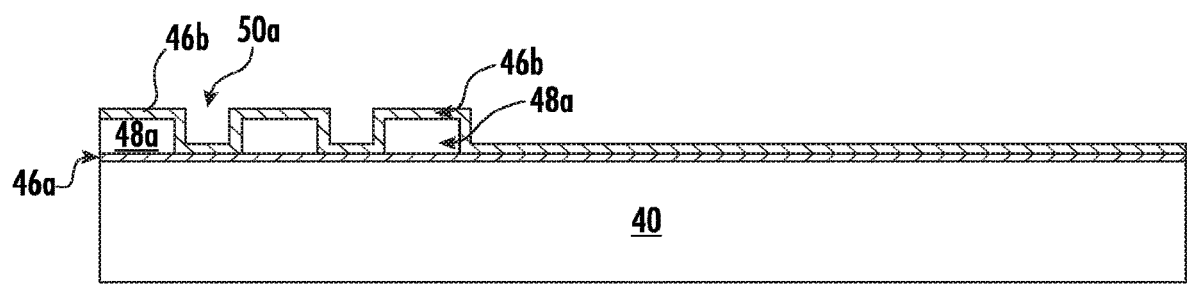

FIG. 3C shows the first photoresist layer 48a may be patterned to form first openings 50a, to provide for the subsequent offset 67 or recess 57 in the mold compound 56. After patterning the first photoresist 48a, a second conductive layer or seed layer 46b is formed. The second seed layer 46b may be made of materials similar or identical to those described with respect to seed layer 46, and with methods similar or identical to those described for seed layer 46. The second conductive seed layer 46b may be non-planar and may be conformally applied over the patterned first photoresist layer 48a and extend into the first openings 50a. The second conductive seed layer 46b can provide a barrier between the first photoresist layer 48a that will remain for subsequent processing, such as the formation of conductive interconnects or posts 52, after the removal of the second photoresist layer 48b that will be formed over, and then stripped from, the second seed layer 46b.

Figure 3D:
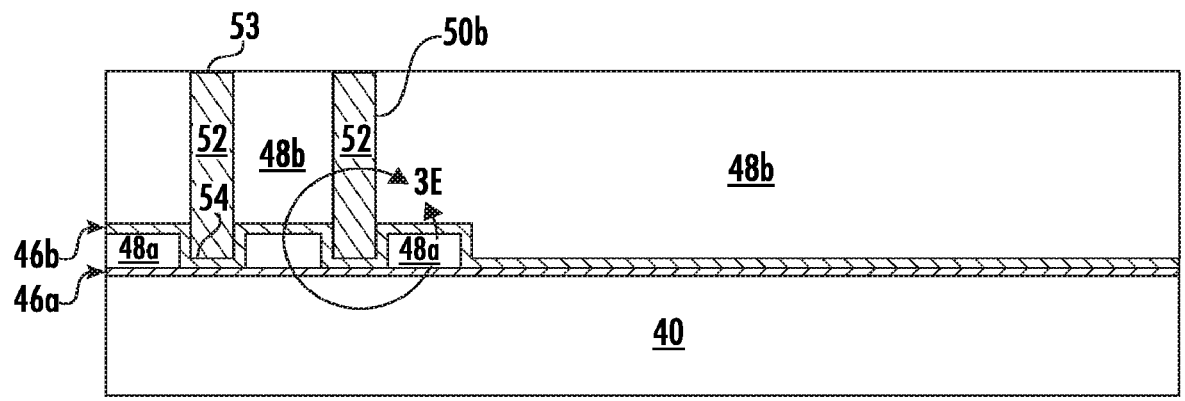

FIG. 3D shows the second photoresist layer 48b may be formed over, and conformally follow, the second seed layer 46b and the first patterned photoresist layer 48a, together with the first openings 50a formed in the first patterned photoresist layer 48a. The second photoresist layer 48b may patterned to form second openings 50b. The second openings 50b may be filled with conductive material to form the conductive interconnects or posts 52. In some instances, the second openings 50b may be aligned with, and formed within the first openings 50a, as shown, e.g., in FIG. 3D. In other instances, the second openings 50b may be offset from, and not be formed within the first openings 50a, as shown, e.g., in FIG. 3F to provide for the subsequent offset 67 or recess 57 in the mold compound 56. The conductive interconnects or post 52 may be formed by a suitable process, such as by an electroplating process in which the second seed layer 46b provides the electrical current for the electroplating process.

Figure 3E:
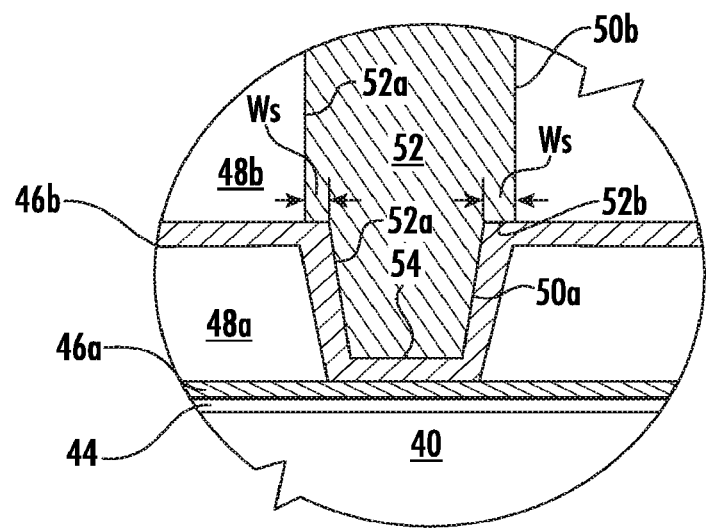

FIG. 3E shows close up profile view of the conductive interconnect or post 52 formed within the first opening 50a and the second opening 50b, as taken from within the section line 3E shown in FIG. 3D. FIG. 3E further shows the additional detail of a step, offset, or discontinuity 52b in the sidewall 52a of the conductive post 52. A width Ws of the step 52b at the interface of the first photoresists 48a and the second photoresist 48b within the second opening 50b may be in a range of 0-15 µm, or thereabout, and may further comprise a change in angle of the sidewall of the first opening 50a and the second opening 50b, which may further result in a change in angle of the sidewall 52a of the conductive post 52.

Figure 3F:
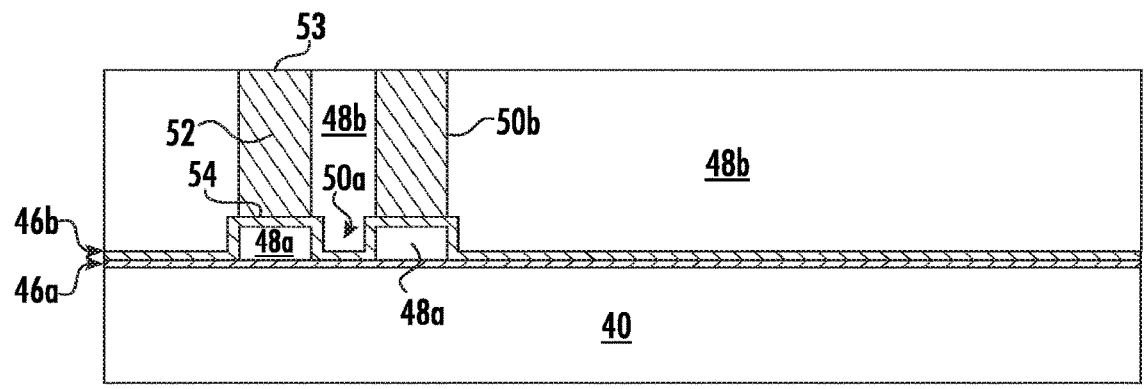

FIG. 3F differs from FIG. 3E by showing that the second openings 50b in the second photoresist layer 48b may be offset from, and not be formed within the first openings 50a. The second openings 50b may instead be aligned with the tops of the patterned first photoresist 48a. As such, when the second openings 50b are filled with conductive material to form the conductive interconnects 52, the conductive interconnects 52 are formed over the first photoresist 48a, with the ends 54 of the conductive posts 52 offset from the lower surface 66 of the encapsulant 56 by the recess 57, and at a distance of 5-50 µm or about 25 µm, to provide the structure shown in FIG. 3K.

Figure 3G:
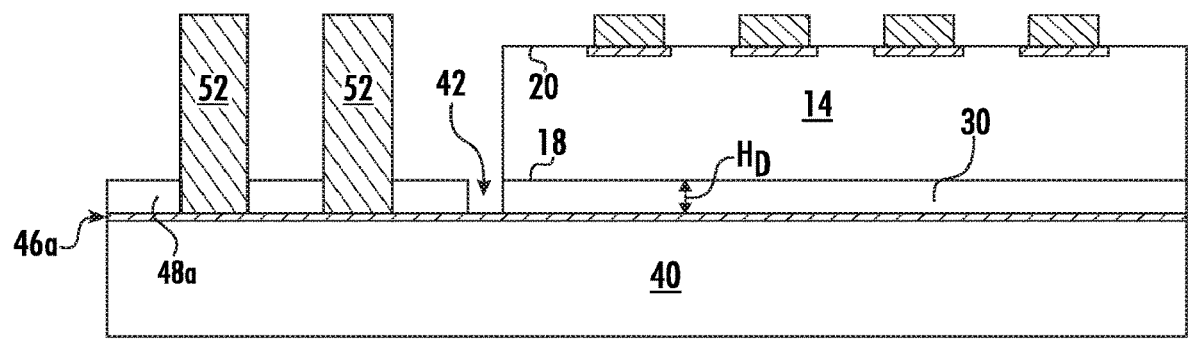
Figure 3H:
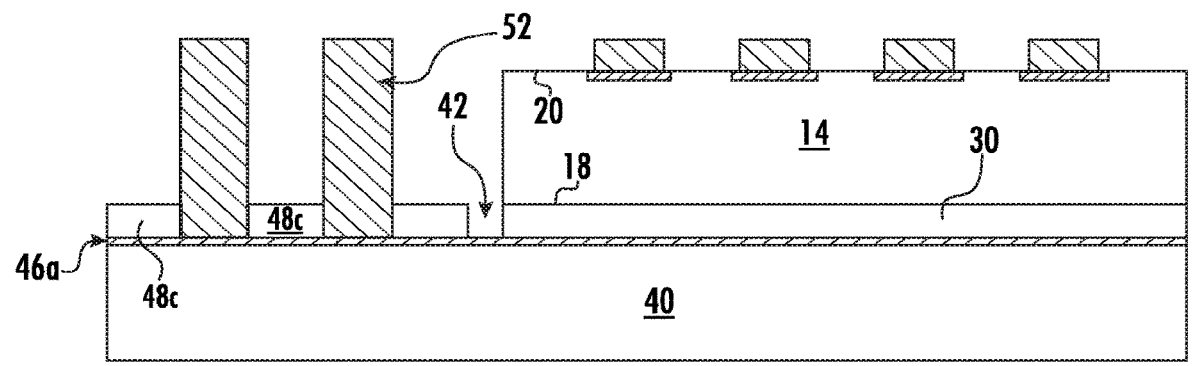
Figure 3I:
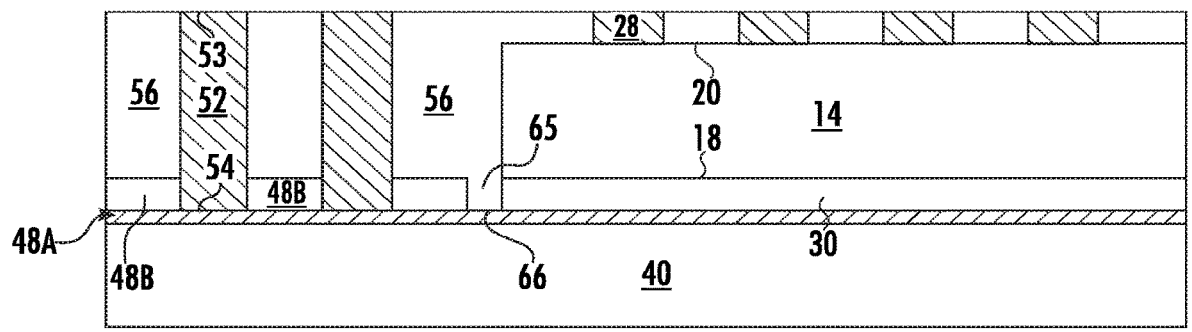
Figure 3J:
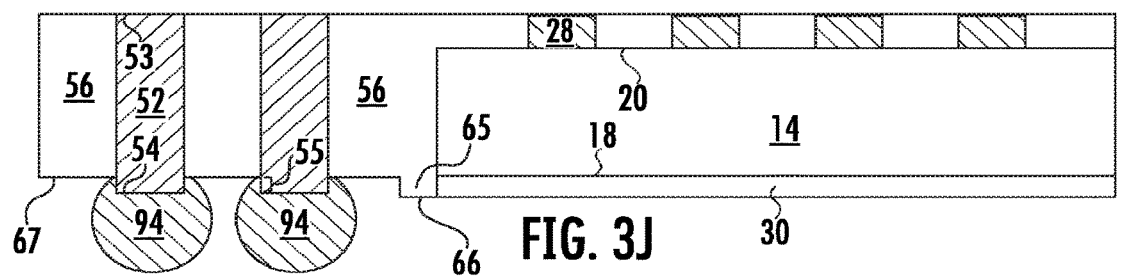

FIG. 3G, continuing from FIG. 3D, shows that before removal of the carrier 40, a thickness of photoresist 48a around, and in a periphery of, the lower ends 54 of the conductive vertical interconnects 52 is present, and provides for the recessed portion 67 of bottom surface 66 of mold compound 56, as shown in FIG. 3J. While not drawn to scale, as a point of reference the carrier 40 may have a height of about 350-400 µm while the semiconductor die may have a height of about 80-100 µm and the semiconductor device 100 a total height of about 100-150 µm, so that an overall height of the carrier 40 semiconductor device 100 together will be about 500 µm.

FIG. 3H, similar to FIG. 3G, shows that before removal of the carrier 40, a thickness of photoresist 48 around, and in a periphery of, the lower ends 54 of the conductive vertical interconnects 52 is present, and provides for the recessed portion 67 of bottom surface 66 of mold compound 56. However, FIG. 3H differs from FIG. 3G in that the resist 48 is not the first resist 48a that remains after the removal or stripping of the second resist 48b and removal or etching of the second seed layer 46b. Instead, the resist 40c may be a liquid photoresist that is formed by spin coating or other suitable method, after the formation of the conductive posts or interconnects 52, and after the removal of the resist layer 48 used in the formation of the conductive posts or interconnects 52.

FIG. 3I, continuing from FIG. 3G or 3H, shows the encapsulant or mold compound 56 formed around the semiconductor die 14, the conductive bumps 28, the conductive posts 52 similar to what was shown and described with respect to FIG. 2D. The semiconductor device of FIG. 3I differs from the semiconductor device of FIG. 2B by the inclusion of the encapsulant or mold compound 56 being disposed around, and contacting, the first photoresist 48a.

FIG. 3J continuing from FIG. 3G or 3H, shows a structure of semiconductor device 100 similar to that shown in, and described with respect to, FIG. 2K. The stackable fully molded flip chip semiconductor structure with vertical Interconnects 100 shown in FIG. 3J, is shown with fine-pitch bumps or solder balls 94 coupled to the conductive posts 52. The conductive bumps or solder balls 94 may comprise a width or diameter of about 50-100 μm, such as at or about 80 μm spacing.

After grinding to remove the carrier, a portion of the photoresist 48a and a lower portion or end 54 of the conductive vertical interconnects 52 may also be removed, to leave a thickness Ho of photoresist 48a equal to a thickness HD of the DAF 30. After grinding and removal of a portion of the photoresist 48, a remaining portion of the photoresist 48 may be removed to leave ends 54 of the conductive vertical interconnects 52 exposed, and the remaining portion of the photoresist 48 that may have small amounts of metal included in its surface after the grinding of the conductive vertical interconnects 52 may also be removed. The additional standoff, offset, or height Ho may provide improved access or clearance for cleaning processes, or for molded underfill (MUF) that may be used after mounting the semiconductor device 100 to a PCB or other substrate.

The DAF 30 may comprise a thickness greater than a final thickness of the encapsulant 56 disposed over the active surface 20 of the semiconductor die 18, or in other words, greater than a height of the conductive bumps 28. However, a portion of the DAF 30 may also be removed until a thickness or height $H_D$ of the DAF 30 is equal, or about equal, to a thickness of the encapsulant over the active surface of the semiconductor die. By retaining a layer of DAF 30 over the backside 18 of the semiconductor die 14, portions of the conductive material from the conductive vertical interconnects 52, such as copper, may be prevented from coming into contact or migrating into the base material of the semiconductor die 14 (such as silicon) of the and damaging performance of the semiconductor die 14.

Figure 3K:
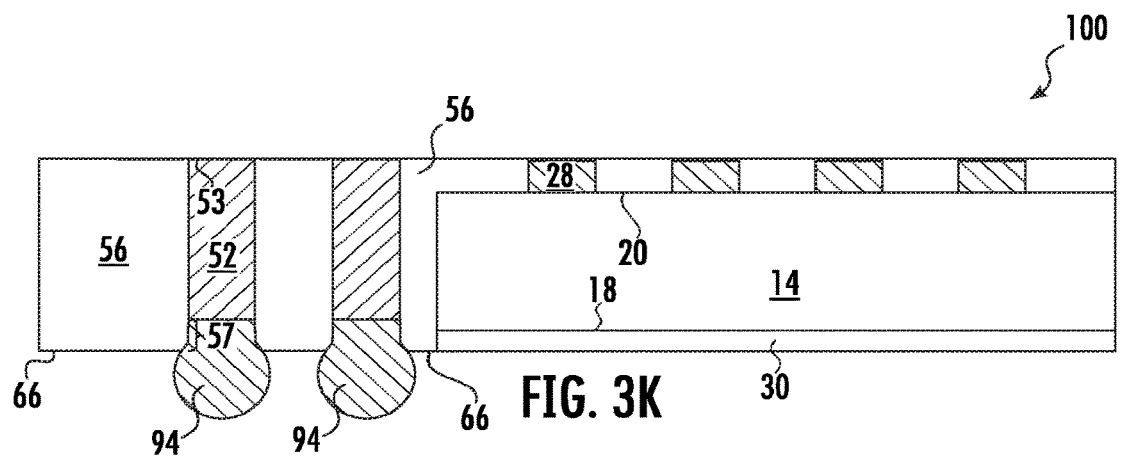

FIG. 3K, continuing from FIG. 3F, shows conductive interconnects 52, after the removal of the first photoresist 48a. By removing the first photoresist 48a, the ends 54 of the conductive posts 52 offset from the lower surface 66 of the encapsulant 56 by the recess 57. The recess 57 comprises a distance of 5-50 μm or about 25 μm from the lower surface 66 the ends 54 of the conductive posts 52, similar to the structure shown in, and described with respect to, FIG. 2L.

FIG. 3K, like FIG. 3J, is shown with fine-pitch bumps or solder balls 94 coupled to the conductive posts 52. The conductive bumps or solder balls 94 may comprise a width or diameter of about 50-100 μm, such as at or about 80 μm spacing.

FIGS. 4A-4F show various views and arrangements of Stackable Fully Molded BGA Semiconductor Structure with Vertical Interconnects similar to the semiconductor device 100 shown and described previously. In each instance, PoP semiconductor devices 102, 104, 106, 108 and 110 are formed without solder balls or bumps 94 disposed between, or among, the vertically separated PoP layers that comprise the semiconductor die 14.

Figure 4A:
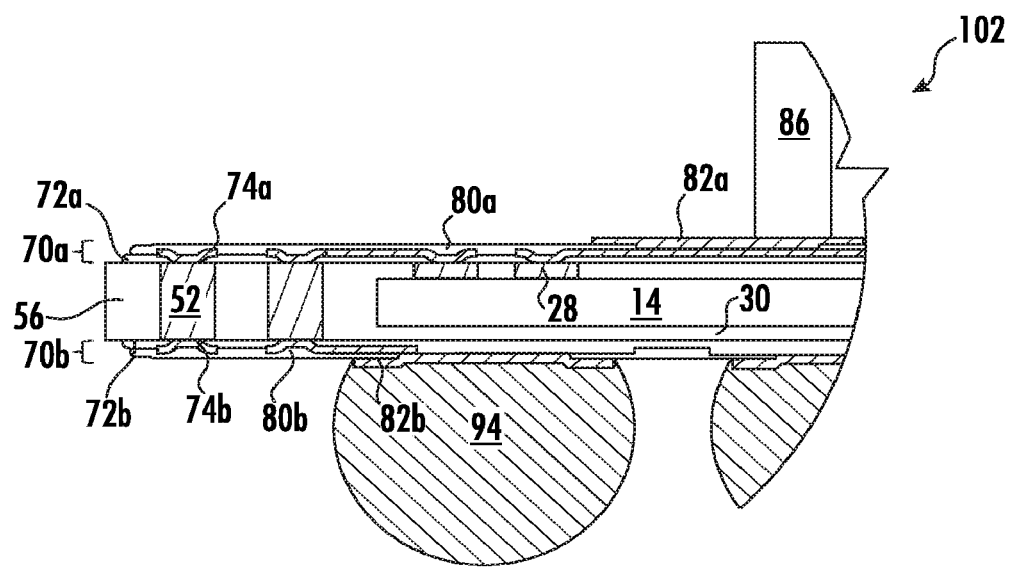
FIGS. 4A-4F illustrate various arrangements and stacking of semiconductor die as part of fully molded peripheral PoP devices.
Figure 4B:
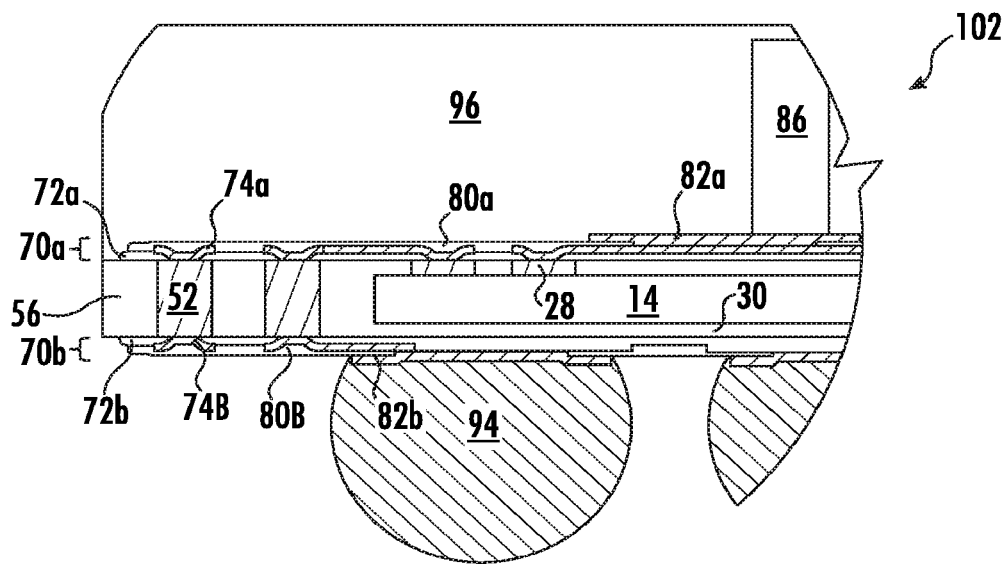

FIGS. 4A and 4B, show a Stackable Fully Molded BGA Semiconductor Structure with Vertical Interconnects 102 and additional electronic components 86 mounted over the top or upper build-up interconnect structure 70 a at a top of the semiconductor structure 102. Semiconductor device 102 differs from semiconductor device 100, shown e.g. in FIG. 2H, by the inclusion of a back side or lower build-up interconnect structure 70b, which may be formed on the carrier before the mounting of the semiconductor die 14 to the carrier 40 and before the formation of the conductive vertical interconnects 52. With the lower build-up interconnect structure 70b, bumps 94 may be formed as part of a ball grid array (BGA) and be positioned within a footprint of the semiconductor die 14. The bumps 94 may also be formed partially or completely within or without of the footprint of the semiconductor die 14.

FIG. 4B differs from FIG. 4A, by further including the additional feature of a second layer of encapsulant or mold compound 96 that may optionally be formed over the additional electronic components 86 and the build-up interconnect structure 70a. By including the second layer of encapsulant 96, additional protection to the electronic components 86 is provided, as well as providing additional rigidity and structural strength to facilitate subsequent handling, such as removal from the carrier 40 and formation of the bumps 94.

Figure 4C:
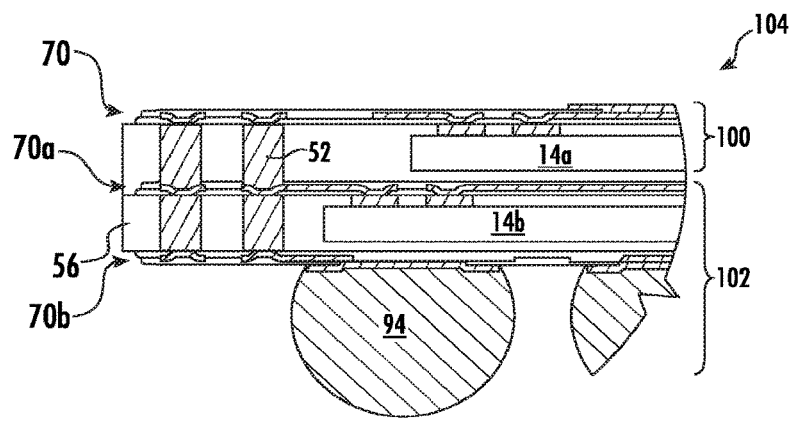

FIG. 4C, shows another embodiment of a semiconductor device or a Stackable Fully Molded BGA Semiconductor Structure with Vertical Interconnects and Components 104. FIG. 4C differs from FIGS. 4A and 4B by comprising more than one vertically stacked layer of encapsulated semiconductor die and conductive vertical interconnects disposed around the periphery of the semiconductor die. More specifically, FIG. 4C shows the lower layer of semiconductor device 104 formed of semiconductor device 102 coupled or vertically stacked in a PoP arrangement with a semiconductor device 100 disposed over the semiconductor device 102. The POSA will appreciate that any desirable number of vertically stacked layers may be incorporated into the structure, such as three, four, or more layers. In some instances, additional electronic components 86 may be mounted or incorporated not only at the top of the package, but in one or more of the vertically stacked layers comprising semiconductor die 14. For example, additional electronic components may be disposed around a periphery or outside a footprint of the semiconductor die, and also be encapsulated or covered by the encapsulant or mold compound.

Figure 4D:
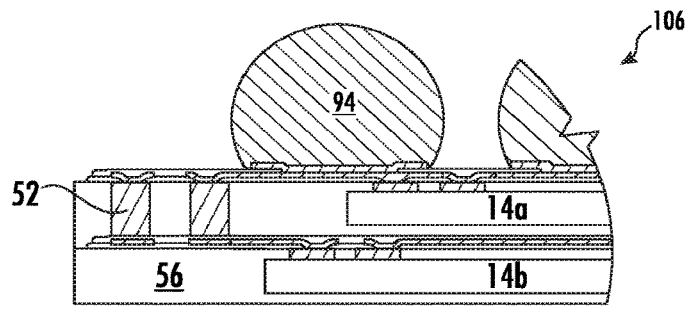

FIG. 4D, shows another embodiment of a semiconductor device or a Stackable Fully Molded BGA Semiconductor Structure with Vertical Interconnects and Components 106. Semiconductor device 106 comprises two vertically stacked layers of face-up semiconductor die with the lower semiconductor die 14b comprising a larger footprint, and the upper semiconductor die 14a comprising smaller footprints contained within the footprint of the larger lower semiconductor die 14b. FIG. 4D differs from FIGS. 4A and 4B by omitting the additional electronic components 86 from the top of the structure, and by placing the bumps or solder balls 94 at the top of the semiconductor device 106 rather than at the bottom of the semiconductor device (as described with respect to a face up orientation of the semiconductor die 14.) The bottom side or backside of the semiconductor device 106 also shows that a bottom side build-up interconnect structure may be omitted, and the balls can be reflowed while still coupled to the carrier 40, and a second carrier may be disposed over the bumps 94 for the removing of the original carrier 40 used during processing, such as by grinding, or other suitable process.

Figure 4E:
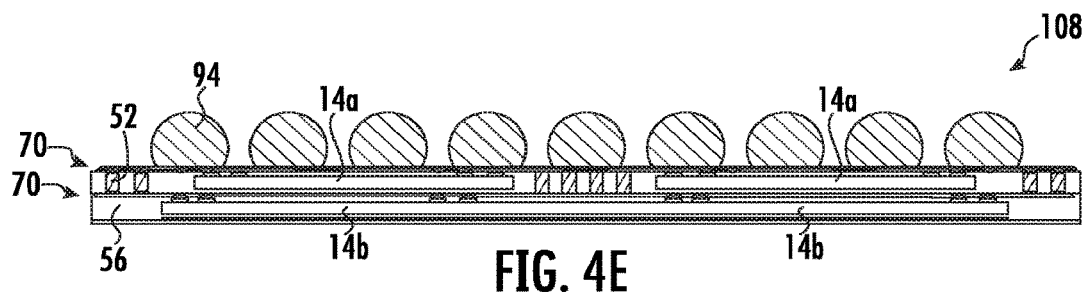

FIG. 4E shows a stacked PoP arrangement or 3D embedded stackable component comprising a semiconductor device 108 in which, the lower single semiconductor die 14b is oriented face-up, and comprises a large footprint. Above the lower, large-footprint semiconductor die 14b, the upper layer comprises two additional semiconductor die 14a in a side by side arraignment, both disposed over, and within a footprint of, the lower semiconductor die 14b. The upper side by side semiconductor die 14a further comprise conductive vertical interconnects 52 disposed at a periphery of the die 14a, included at a shared periphery between the semiconductor die 14a. A thickness or height of the upper and lower semiconductor die 14a and 14b may be equal or substantially equal. While two layers of vertically stacked semiconductor die 14, such as semiconductor die 14a and 14b are shown being interconnected with conductive posts 52 and build-up interconnect layers 70, any desirable number of layers may be used in forming the stacked PoP arrangement or 3D embedded stackable component. For example, in some instances three, four, or more layers of molded or embedded semiconductor die 14 may be used. In some instances, all of the layers within the semiconductor device 108 may be formed over a single carrier, such as to form a PoP structure without intermediate solder bumps or balls 94. In other instances, layers of the stacked PoP arrangement or 3D embedded stackable component may be formed over different wafers and then later joined.

FIG. 4E also omits the additional electronic components 86 from the top of the structure, and places the balls of solder bumps 94 at the top of the structure 108 rather than at the bottom of the structure. Additionally, the backside of the structure also shows that the bottom side build-up interconnect structure 70 may also be omitted, and the balls 94 can be reflowed while still coupled to the carrier 40, and a second temporary carrier may be disposed over the bumps 94 for the removing of the original carrier 40 used during processing, such as by grinding, or other suitable process. A POSA will appreciate the additional electronic components 86 as well as various arrangements of build-up interconnect structures 70 and balls or bumps 94 may also be included according to a configuration, arrangement, or design of the semiconductor device 108.

Figure 4F:
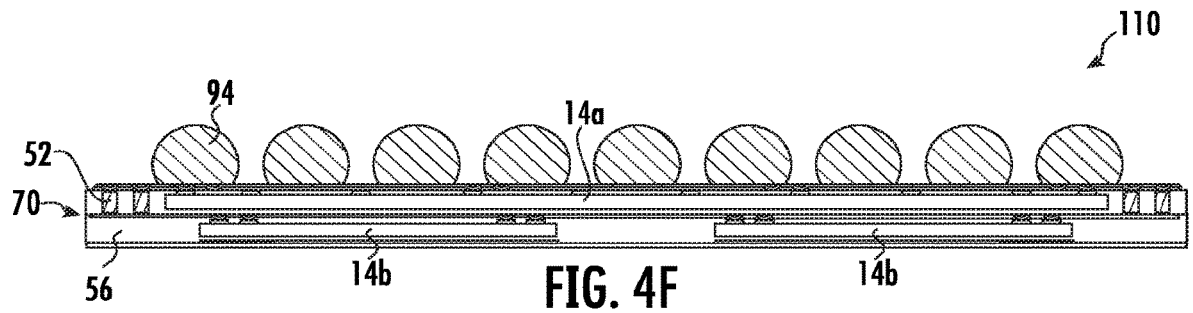

FIG. 4F shows a semiconductor device or Stackable Fully Molded BGA Semiconductor Structure with Vertical Interconnects 110 comprising a stacked PoP arrangement or 3D embedded stackable component. FIG. 4F differs from FIG. 4E by disposing the semiconductor die 14a with the larger footprint above or over the two semiconductor die 14b with smaller footprints. While two layers of vertically stacked semiconductor die 14, such as semiconductor die 14a and 14b are shown being interconnected with conductive posts 52 and build-up interconnect layers 70, any desirable number of layers may be used in forming the stacked PoP arrangement or 3D embedded stackable component. For example, in some instances three, four, or more layers of molded or embedded semiconductor die 14 may be used. In some instances, all of the layers within the semiconductor device 110 may be formed over a single carrier, such as to form a PoP structure without intermediate solder bumps or balls 94. In other instances, layers of the stacked PoP arrangement or 3D embedded stackable component may be formed over different wafers and then later joined.

Like the semiconductor device 108 of FIG. 4E, the semiconductor device 110 of FIG. 4F also omits the additional electronic components 86 from the top of the structure, and places the bumps or solder balls 94 at the top of the structure rather than at the bottom of the structure (as described with respect to a face up orientation of the semiconductor die 14.) Additionally, the backside of the semiconductor device 110 also shows that the bottom side build-up interconnect structure may be omitted, and the bumps or solder balls 94 can be reflowed while still coupled to the carrier 40. A second temporary carrier may be disposed over the bumps 94 for the removing of the original carrier 40 used during processing, such as by grinding, or other suitable process. A POSA will appreciate the additional electronic components 86 as well as various arrangements of build-up interconnect structures 70 and balls or bumps 94 may also be included according to a configuration, arrangement, or design of the semiconductor device 110.

While this disclosure includes a number of embodiments in different forms, the particular embodiments presented are with the understanding that the present disclosure is to be considered as an exemplification of the principles of the disclosed structures, devices, methods, and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A semiconductor device, comprising:
   an embedded device comprising a first surface, a second surface opposite the first surface, and conductive studs disposed over the first surface;
   an encapsulant disposed over at least five sides of the embedded device and around a periphery of the embedded device; and
   a plurality of conductive posts disposed around the periphery of the embedded device, wherein:
   sides of the plurality of conductive posts directly contact the encapsulant,
   each of the plurality of conductive posts extends completely through the encapsulant and each of the plurality of conductive posts further comprises a first end and a second end opposite the first end,
   the first end is exposed from the encapsulant and is coplanar with a first surface of the encapsulant and the conductive studs,
   the second end is exposed from a second surface of the encapsulant opposite the first surface of the encapsulant, wherein the second end extends outwardly from a recessed portion of the second surface of the encapsulant by an offset, wherein the offset comprises a distance in a range of 5-50 μm, and each of the plurality of conductive posts are formed from a continuous, unitary material between the first end and the second end.

2. The semiconductor device of claim 1, wherein the embedded device comprises an active device, a semiconductor die comprising an active surface formed at the first surface, an integrated passive device (IPD), or a passive device.

3. The semiconductor device of claim 1, further comprising conductive bumps formed over the second end and adjacent sides of each of the conductive posts.

4. The semiconductor device of claim 1, wherein the semiconductor device further comprises a redistribution layer (RDL) formed over and coupled with the first end of each of the conductive posts.

5. The semiconductor device of claim 1, wherein the semiconductor device further comprises a second semiconductor device with a footprint matching a footprint of the semiconductor device.

6. The semiconductor device of claim 5, wherein:
the second semiconductor device is disposed over and is electrically connected with the semiconductor device; and
a footprint of the embedded device of the semiconductor device is different from, and does not align with, a footprint of an embedded device of the second semiconductor device.

7. A semiconductor device, comprising:
an embedded device;
an encapsulant disposed over at least five sides of the embedded device and around a periphery of the embedded device; and
a plurality of conductive posts disposed around the periphery of the embedded device and extending through the encapsulant, wherein:
sides of the plurality of conductive posts directly contact the encapsulant, and each of the plurality of conductive posts extends completely through the encapsulant;
wherein each of the plurality of conductive posts comprises a continuous material comprising a first end exposed from the encapsulant and a second end exposed from the encapsulant, the second end being opposite the first end;
wherein the second end of each of the conductive posts is adjacent a backside of the embedded device and the second end is offset above, and extends beyond, a bottom surface of the encapsulant around the periphery of the embedded device by a distance in a range of 5-50 μm.

8. The semiconductor device of claim 7, wherein the embedded device comprises an active device, a semiconductor die comprising an active surface, an integrated passive device (IPD), or a passive device.

9. The semiconductor device of claim 7, wherein the first ends of the conductive posts are recessed below a planar surface of the encapsulant.

10. The semiconductor device of claim 7, wherein both the first end and the second end of the conductive posts are exposed with respect to the encapsulant.

11. The semiconductor device of claim 7, further comprising forming a conductive bump over the first end of each of the conductive posts.

12. The semiconductor device of claim 7, wherein the semiconductor device further comprises a redistribution layer (RDL) formed over and coupled with the first end of each of the conductive posts.

13. The semiconductor device of claim 7, wherein the semiconductor device further comprises a second semiconductor device with a footprint matching a footprint of the semiconductor device.

14. The semiconductor device of claim 13, wherein:
the second semiconductor device is disposed over and is electrically connected with the semiconductor device; and
a footprint of the embedded device of the semiconductor device is different from, and does not align with, a footprint of an embedded device of the second semiconductor device.

15. The semiconductor device of claim 7, wherein:
the plurality of conductive posts are formed of a unitary material; and
the first end exposed from the encapsulant for each of the plurality of conductive posts is offset above, and extends beyond, a planar surface of the encapsulant.

16. The semiconductor device of claim 7, further comprising a rim of encapsulant wrapped around a backside of the embedded device, the rim of encapsulant comprising a width in a range of 10-100 μm.

17. The semiconductor device of claim 7, further comprising:
a die attach film disposed over a back surface of the embedded device; and
the first end exposed from the encapsulant for each of the plurality of conductive posts is positioned at a same height as a height of the die attach film.

18. The semiconductor device of claim 1, further comprising a rim of encapsulant wrapped around the second surface of the embedded device, the rim of encapsulant comprising a width in a range of 10-100 μm.

19. The semiconductor device of claim 1, further comprising:
a die attach film disposed over a back surface of the embedded device; and
the second end for each of the plurality of conductive posts exposed from the encapsulant and positioned at a same height as a height of the die attach film.

* * * * *